US006864422B1

(12) United States Patent
Dionne et al.

(10) Patent No.: US 6,864,422 B1
(45) Date of Patent: Mar. 8, 2005

(54) ELECTRICAL ISOLATION OF AN ELECTRONIC DEVICE

(75) Inventors: Dan Dionne, Hubbardston, MA (US); James May, Milford, MI (US); Charles L. Chisolm, Beverly Hills, MI (US); Suresh Chintalapati, Westborough, MA (US)

(73) Assignee: Bose Corporation, Framingham, MA (US)

( * ) Notice: Subject to any disclaimer, the term of this patent is extended or adjusted under 35 U.S.C. 154(b) by 0 days.

(21) Appl. No.: 10/713,314

(22) Filed: Nov. 14, 2003

(51) Int. Cl.[7] .................................................. H05K 5/02
(52) U.S. Cl. .................. 174/51; 174/40 CC; 174/35 R; 174/6; 439/98
(58) Field of Search .......................... 174/51, 40 CC, 174/35 R, 6, 78; 439/92, 98

(56) References Cited

U.S. PATENT DOCUMENTS

| 3,462,760 A | | 8/1969 | Wetzel ........................ 340/390 |
| 3,870,392 A | * | 3/1975 | Bond ............................ 439/92 |
| 4,393,560 A | * | 7/1983 | Kato ............................ 24/295 |
| 4,793,599 A | | 12/1988 | Ishioka ...................... 267/140.1 |
| 5,020,765 A | * | 6/1991 | Evans et al. ................. 248/539 |
| 6,011,218 A | * | 1/2000 | Burek et al. ............. 174/40 CC |
| 6,644,713 B2 | * | 11/2003 | Del Pozo Abejon et al. .... 296/39.1 |

FOREIGN PATENT DOCUMENTS

| EP | 0 516 466 B1 | 2/1992 | ........... H01R/23/70 |
| WO | WO 96/31994 | 10/1996 | ............ H04R/1/08 |

* cited by examiner

Primary Examiner—Dhiru R. Patel
(74) Attorney, Agent, or Firm—Fish & Richardson P.C.

(57) ABSTRACT

A clip includes an integral u-shaped body of insulating material including two parallel fingers joined by a spine to define a gap between the fingers. The fingers have respective holes each sized to receive a screw, the holes being coaxial. At least one of the fingers has a projection that projects into the gap, the hole of the respective finger being contained at least partially within the projection. The body is sufficiently resilient to permit the two parallel fingers to be spread apart. A leading edge of the projection is

15 Claims, 8 Drawing Sheets

US 6,864,422 B1

ELECTRICAL ISOLATION OF AN ELECTRONIC DEVICE

SUMMARY

In general, in one aspect, the invention features a clip that includes an integral u-shaped body of insulating material including two parallel fingers joined by a spine to define a gap between the fingers. The fingers have respective holes each sized to receive a screw, the holes being coaxial. At least one of the fingers has a projection that projects into the gap, the hole of the respective finger being contained at least partially within the projection. The body is sufficiently resilient to permit the two parallel fingers to be spread apart. A leading edge of the projection is beveled.

Implementations of the invention may include one or more of the following features. Both of the fingers have projections and the projections project toward one another. The projections fully surround each of the holes in the fingers. The clip also includes a non-integral internally threaded nut. A channel is defined by a wall that is integrally formed with the clip and has a hole that is coaxial with the holes of the fingers. The nut is held in line with the two holes of the fingers. A hook projects in a direction other than the direction in which the fingers project from the spine of the clip. The hook is formed integrally with the fingers of the clip. The hook projects at a location that is on the other side of one of the fingers from the gap.

In general, in another aspect, the invention features (a) a metal portion of a housing of an electronic device, the metal portion including a tab having upper and lower parallel surfaces and an aperture between the surfaces configured to receive a screw, the tab including guiding elements projecting above at least one of the parallel surfaces, and (b) a clip comprising an integral unshaped body of insulating material including two parallel fingers joined by a spine to define a gap between the fingers, the tab lying within the gap.

The fingers have respective holes each sized to receive a screw, the holes being coaxial with each other and with the aperture of the tab. At least one of the fingers has a projection that projects into the gap and is seated within the aperture. The body is sufficiently resilient to permit the two parallel fingers to be spread apart. A leading edge of the projection is beveled.

Implementations of the invention include one or more of the following features. The guiding elements comprise ridges. The ridges comprise portions that lie parallel to sides of the clip, and portions that flare away from the parallel portions.

In general, in another aspect, the invention features a method comprising (a) pressing an insulating clip against a flat metal tab of a housing of an electronic device to force two fingers of the clip apart to enable the metal tab to occupy a gap between the two fingers, and (b) pressing the insulating clip to cause a projection of one of the fingers to seat in a hole of the metal tab, the clip being guided during the pressing by guiding elements that project above a surface of the tab.

Implementations of the invention may include one or more of the following features. Screws are inserted through coaxial holes in the fingers and the tab to mount the housing on a metal body. Screws are inserted through a hole in a metal sheet, through coaxial holes in the fingers and the tab, and into a nut attached to the clip.

In general, in another aspect, the invention features a method comprising (a) temporarily mounting an audio amplifier on a sheet metal panel of an automobile body by positioning hooks that are held on tabs of a housing of the amplifier, at positions adjacent to edges of the metal panel, and (b) while the amplifier is temporarily mounted, inserting screws through holes in the tabs and through holes of fingers of clips to which the hooks belong to more permanently mount the amplifier on the sheet metal panel.

Other advantages and features will become apparent from the following description, and from the claims.

DETAILED DESCRIPTION OF EMBODIMENTS OF THE INVENTION

Figure 1:
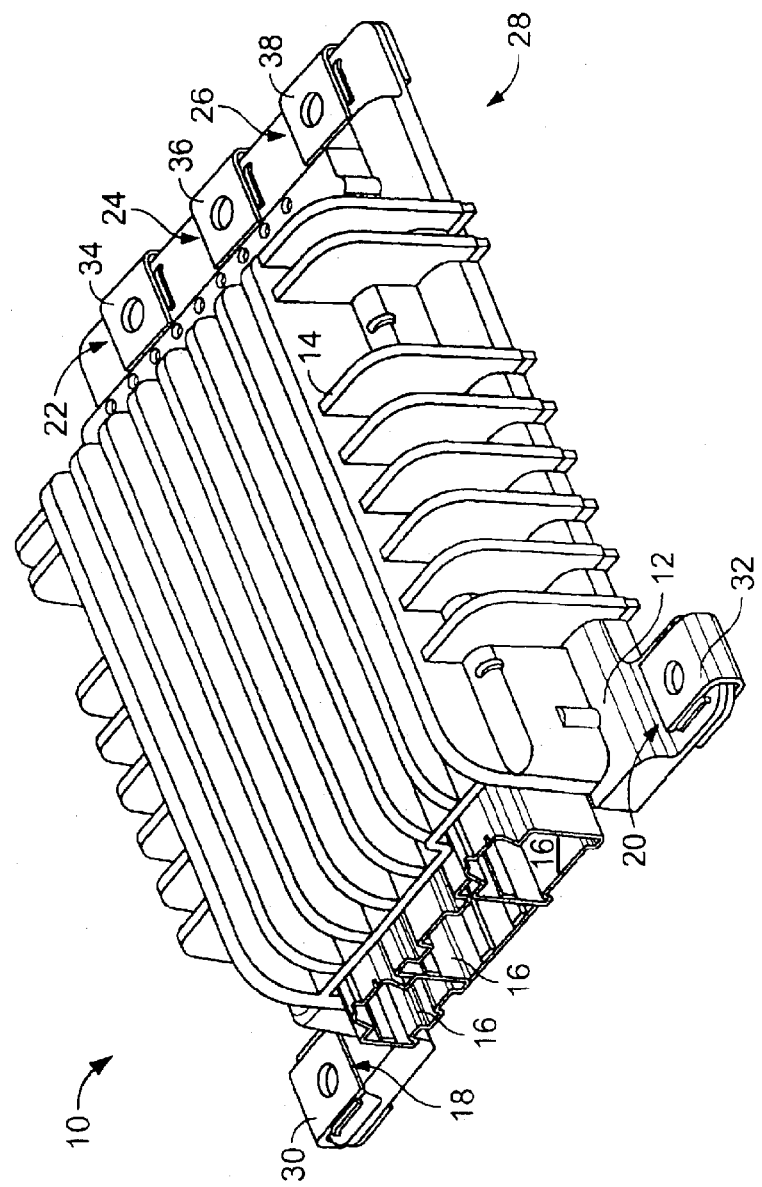
FIG. 1 is a perspective top view of an amplifier.

As shown in FIG. 1, an example audio amplifier 10 of an automobile sound system includes a metal casting 12 that is a part of a housing and bears fins 14 to sink heat from the amplifier to the surrounding air. Connectors 16 receive plugs or sockets of cables that connect the amplifier to loudspeakers or other parts of the sound system.

The casting 12 in the example includes five mounting locations 18, 20, 22, 24, 26 at which screws may be used to mount the amplifier securely to a sheet metal panel 28 of the body of the automobile. At each of the mounting locations an electrically insulative clip 30, 32, 34, 36, 38 is held on a mounting tab of the casting.

Figure 2:
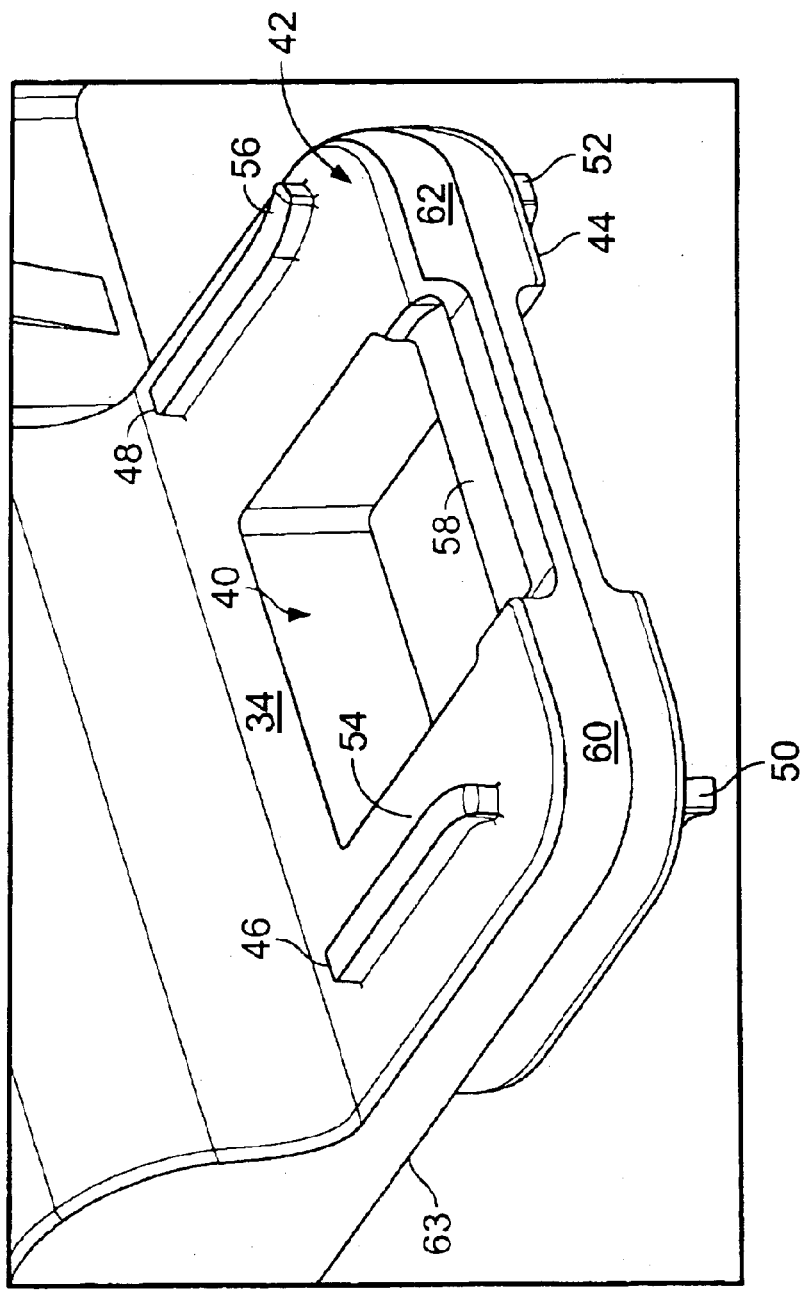
FIG. 2 is a perspective top view of a tab.
Figure 5:
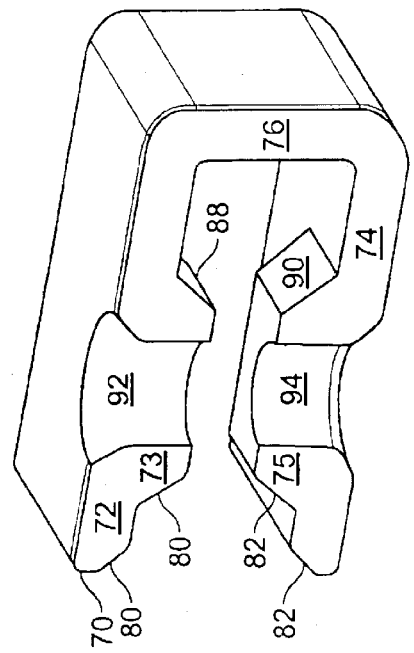
FIGS. 3, 4, and 5 are side, perspective, and cutaway perspective views of a clip.
Figure 3:
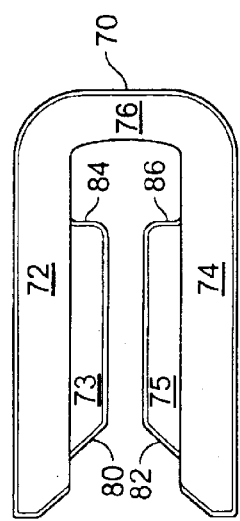
Figure 4:
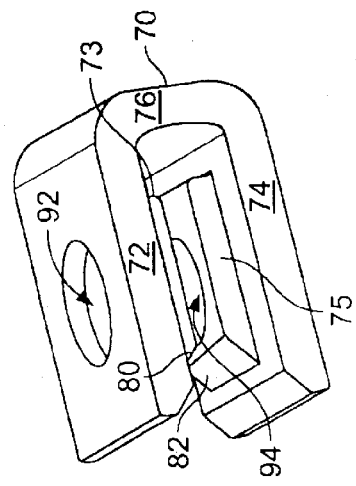
Figure 6:
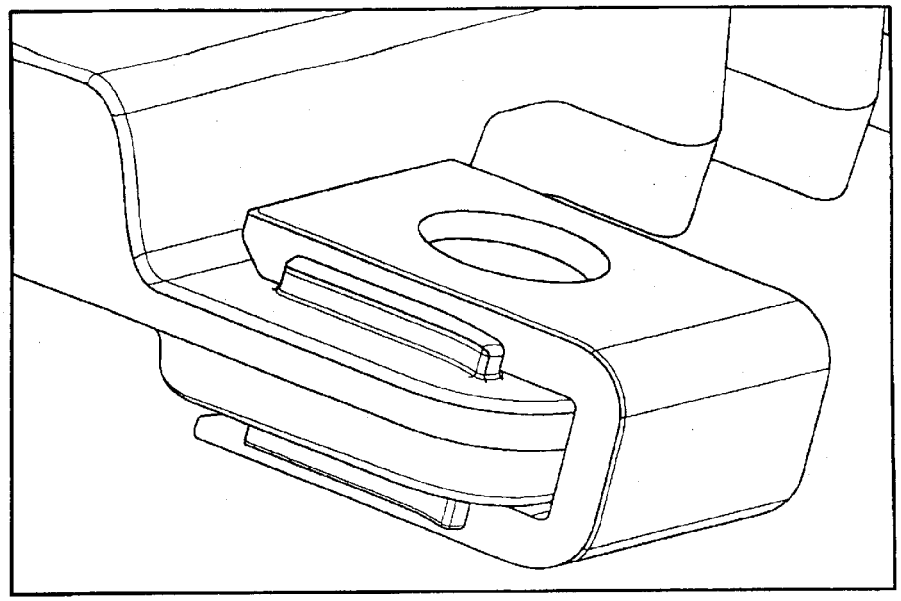
FIG. 6 is a perspective view of a mounted clip.

As shown in FIG. 2, each mounting tab 34 has a rectangular hole 40 passing from a top surface 42 to a bottom surface 44. On each of the top surface and the bottom surface are formed a pair of retaining ridges 46, 48, 50, 52 that serve as guiding elements. The guide ridges are parallel along much of their lengths and end in flared guide surfaces 54, 56 for a purpose described later. The outermost side of the rectangular hole is bounded by a bridge 58 that is thinner than the adjacent portions of the tab. The outer corners 60, 62 of the tab are curved.

Half of the thickness of the tab projects below the bottom surface 63 of the amplifier casting to assure that the amplifier casting, when mounted, does not bear against the sheet metal panel except at the tabs. This aids the flow of cooling air between the casting and the metal panel and accommodates any imperfections or projections on the upper surface of the metal panel.

As shown in FIGS. 3, 4, 5, and 6 each insulative clip 70 is an integral U-shaped molded piece of nylon-6. Two fingers 72, 74 of the clip are joined by a spine 76 to define a gap between the fingers. The free ends of the two fingers are beveled for easy mounting onto a tab of the casting. Two projections 73, 75 project from inner surfaces of the two fingers of the clip. The projections are generally rectangular and configured to seat within the upper and lower entrances of the hole 40 in the tab. Each projection has a beveled leading edge 80, 82 and a vertical trailing edge 84, 86 to permit the clip to be easily mounted onto the tab and less easily removed from the tab. (In FIG. 5, in an alternative example, the trailing edges 88, 90 of the projections end are also beveled to make removal easier.

Each of the fingers and projections has a hole 92, 94 that is perpendicular to the surface of the finger. The two holes 92, 94 are coaxial and sized to receive a bolt or screw (for example, a self tapping metal screw) to be inserted through both holes from the top of the clip and into the sheet metal panel of the body of the vehicle (and, in some examples, through a hole in the sheet metal screw to a nut on the other side). The entrance to each of the holes 92, 94 is tapered to make it easy to insert the screw.

Figure 7:
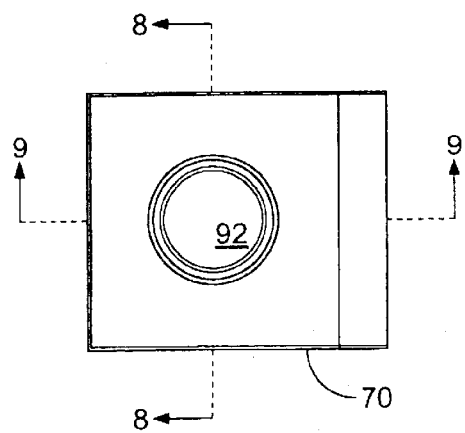
FIGS. 7, 8, and 9 are top, side sectional, and end sectional views of a clip.
Figure 8:
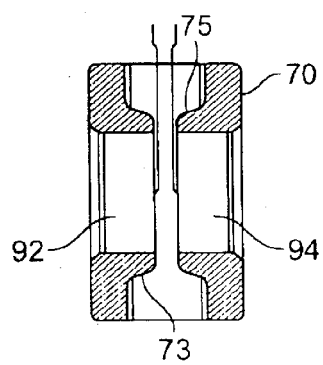
Figure 9:
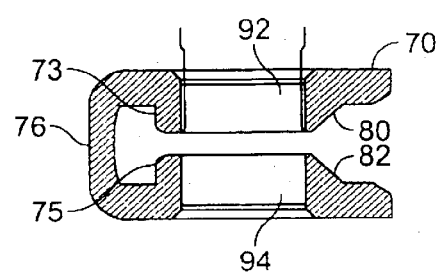

FIGS. 7, 8, and 9 show additional details of the clip.

To mount the clip, the installer places the open end of the clip at the outer edge of the tab and pushes the clip towards the tab with the upper and lower fingers each being guided between ridges 46, 48, 50, 52. The beveled leading edges of the two projections force the clip to open and with additional pushing the projections seat within the upper and lower openings of hole 40. Once installed a screw is inserted through the two holes 92, 94 and into the sheet metal. The two insulated projections prevent the screw from touching the metal casting of the amplifier and thus electrically isolate the casting from the sheet metal panel. To completely mount the amplifier, clips are mounted on all of the tabs and screws are used to attach the tabs to the sheet metal panel.

To unmount the amplifier, the screws are removed. The clips may also be removed from the tabs using an instrument to pry them open and slide them off.

The clips may be mounted on the tabs by the manufacturer of the casting or later by the manufacturer of the amplifier, or by the installer at the time of installation. The clip is inexpensive and simple to use and can be installed without error and without using adhesives or other substrates. The clip can be installed on a tab either right side up or upside done, simplifying assembly. The amplifier chassis is electrically isolated from the sheet metal panel, and the clip is electrically isolated from both the chassis and the panel.

Although the clip and the related tab configuration of the casting have been described in the context of an amplifier of a sound system mounted in an automobile, the clip and tab configuration can also be used in other contexts, for example, with other kinds of vehicles, with other kinds of audio equipment, and with other kinds of non-audio equipment.

The clips and tabs can have a variety of other configurations.

Figure 10:
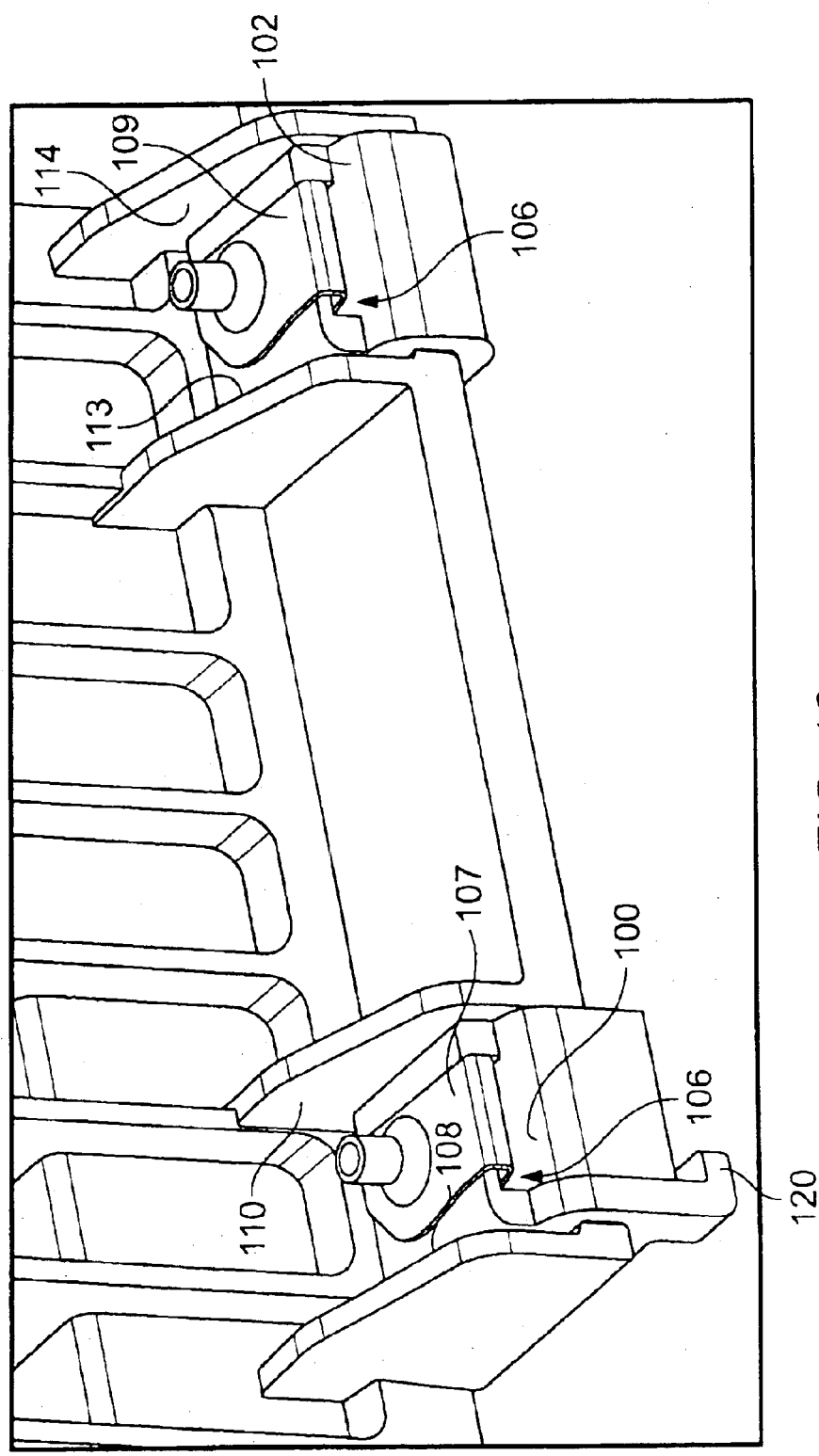
FIG. 10 is a perspective top view of mounted clips.

For example, as shown in FIG. 10, the clips 100, 102 can include an upper channel 104, 106, to receive a J-nut 107, 109. Each tab can include side walls 108, 110, 112, 114.

Figure 11:
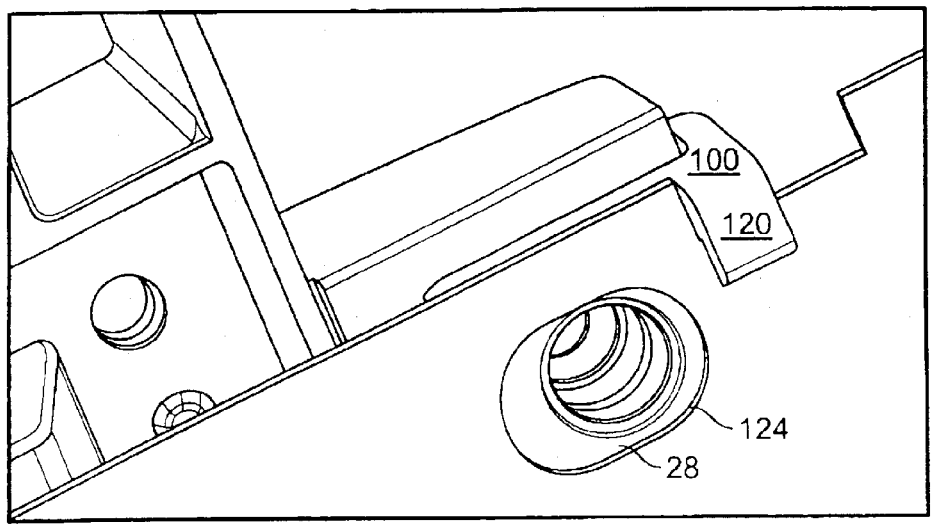
FIGS. 11 and 12 are perspective bottom views of a termporarly moutned casting.
Figure 12:
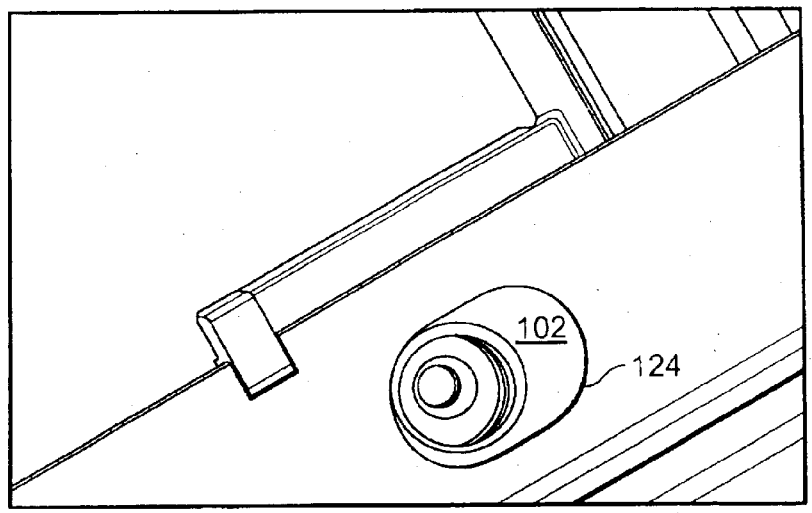

Clip 100 represents a different variation compared to clip 102. As shown in FIG. 11, clip 100 includes a hook 120 that can grab an edge of the sheet metal panel 28 to hold the casting in place temporarily while the installer inserts the screws, without the installer needing to hold the amplifier with one hand. The hook may seat in a notch 122 cut in an edge of the sheet metal panel, or may simply grab a straight edge of the panel as shown in FIG. 12 (the hook shown in FIG. 12 is on the opposite side of its clip from the hook shown in FIG. 11). In each case, a hole 124 in the panel, through which the screw is inserted is elongated to permit adjustment of the position of the casting as the screws are inserted. The hook is arranged to project in a direction other than the direction in which the fingers of the clip project from the spine of the clip, and to project at a location that is on the other side of one of the fingers from the gap between the fingers.

Figure 13:
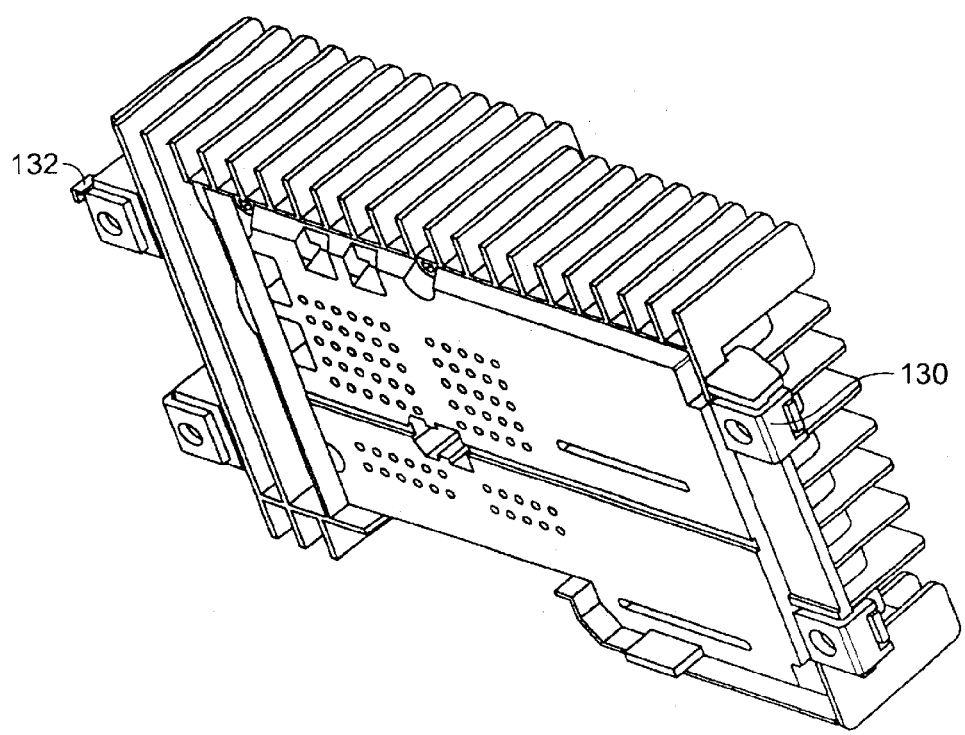
FIG. 13 is a perspective bottom view of an amplifier with clips.

The J-nuts permit mounting the casting using machine screws inserted from the sheet metal panel side, through the clips and into the J-nuts as illustrated in FIG. 13 (which shows the bottom of the amplifier with four clips, two of which have hooks and two of which do not. Using the J-nuts precludes the need for nuts or other special mounting provisions to be made on the sheet metal panel. As shown in FIG. 13, there are two may be different configurations of clips with hooks in which the hooks 130, 132 have opposite orientations with respect to the clips.

Figure 14:
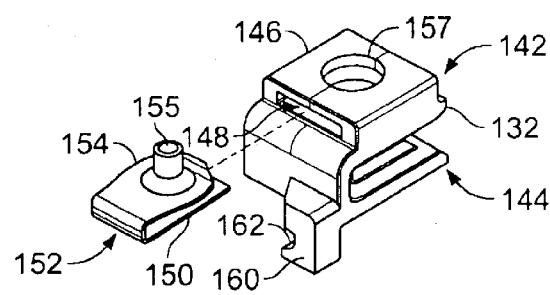
FIGS. 14 and 15 are perspective views of alternative clips.
Figure 15:
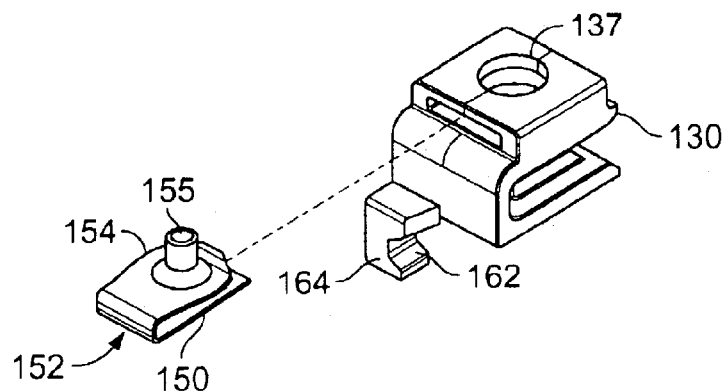

Additional detail of the two different clips with hooks are shown in FIGS. 14 and 15. As shown in FIG. 14, the clip 140 is not vertically symmetrical but rather has a top 142 and a bottom 144. On the top, an upper wall 146 is formed to define a channel 148 into which the bottom leaf 150 of a shake-proof J-nut 152 is inserted. The upper leaf 154 of the J-nut, when mounted, lies on top of wall 146 and bears an internally threaded cylindrical nut 155. The upper wall 146 of the clip has a hole 157 that is coaxial with the other two holes in the clip so that the tip of a screw may pass up through all three holes and into the nut.

A hook 160 on one side of the clip faces toward the clip. The hook has a beveled surface 162 that enables it to be easily fit onto an edge of the sheet metal panel. As shown in FIG. 15, the other version of the clip is similar except that its hook 164 lies on the other side of the clip. Providing two different versions of the clip enables tabs in a variety of positions and orientations on the casting to be fitted with clips that can hook onto sheet metal panels that have various configurations and edges.

Figure 16:
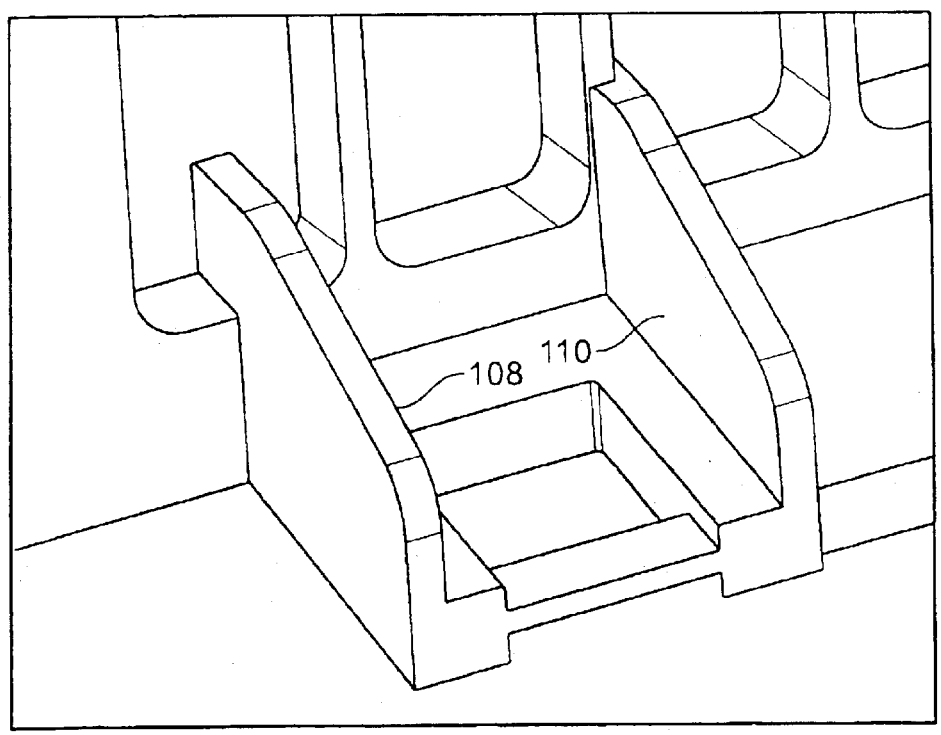
FIG. 16 is a perspective view of a tab.

The tabs used with the clips, for example, the J-nut clips, may have the configuration shown in FIG. 16, which includes tapered side walls 108, 110.

Other implementations are also within the scope of the following claims.

What is claimed is:

1. A clip comprising
    an integral unshaped body of insulating material including two parallel fingers joined by a spine to define a gap between the fingers,
    the fingers having respective holes each sized to receive a screw, the holes being coaxial,
    at least one of the fingers having a projection that projects into the gap, the hole of the respective finger being contained at least partially within the projection,
    the body being sufficiently resilient to permit the two parallel fingers to be spread apart,
    a leading edge of the projection being beveled.

2. The clip of claim 1 in which both of the fingers have the projections and the projections project toward one another.

3. The clip of claim 1 in which the projections fully surround each of the holes in the fingers.

4. The clip of claim 1 also including a non-integral internally threaded nut.

5. The clip of claim 4 in which a channel is defined by a wall that is integrally formed with the clip and has a hole that is coaxial with the holes of the fingers.

6. The clip of claim 4 in which the nut is held in line with the two holes of the fingers.

7. The clip of claim 1 also including a hook projecting in a direction other than the direction in which the fingers project from the spine of the clip.

8. The clip of claim 7 in which the hook is formed integrally with the fingers of the clip.

9. The clip of claim 7 in which the hook projects at a location that is on the other side of one of the fingers from the gap.

10. An apparatus comprising
    a metal portion of a housing of an electronic device, the metal portion including a tab having upper and lower parallel surfaces and an aperture between the surfaces configured to receive a screw,
    the tab including guiding elements projecting above at least one of the parallel surfaces, and a clip comprising
    an integral unshaped body of insulating material including two parallel fingers joined by a spine to define a gap between the fingers, the tab lying within the gap,
    the fingers having respective holes each sized to receive a screw, the holes being coaxial with each other and with the aperture of the tab,
    at least one of the fingers having a projection that projects into the gap and is seated within the aperture,
    the body being sufficiently resilient to permit the two parallel fingers to be spread apart,
    a leading edge of the projection being beveled.

11. The apparatus of claim 10 in which the guiding elements comprise ridges.

12. The apparatus of claim 11 in which the ridges comprises portions that lie parallel to sides of the clip, and portions that flare away from the portions that lie parallel.

13. A method comprising pressing an insulating clip against a flat metal tab of a housing of an electronic device to force two fingers of the clip apart to enable the metal tab to occupy a gap between the two fingers, and pressing the insulating clip to cause a projection of one of the fingers to seat in a hole of the metal tab, the clip being guided during the pressing by guiding elements that project above a surface of the tab.

14. The method of claim 13 also including inserting screws through coaxial holes in the fingers and the tab to mount the housing on a metal body.

15. The method of claim 13 also including inserting screws through a hole in a metal sheet, through coaxial holes in the fingers and the tab, and into a nut attached to the clip.

* * * * *